United States Patent
Lutz et al.

(10) Patent No.: US 9,844,146 B2
(45) Date of Patent: Dec. 12, 2017

(54) ELECTRICAL CIRCUITRY ASSEMBLY AND METHOD FOR MANUFACTURING THE SAME

(71) Applicant: Flextronics Automotive GmbH & Co. KG, Filderstadt (DE)

(72) Inventors: Peter Lutz, Nagold (DE); Kevin Buermann, Lakeville, MN (US)

(73) Assignee: Flextronics Automotive GmbH & Co. KG, Filderstadt (DE)

( * ) Notice: Subject to any disclaimer, the term of this patent is extended or adjusted under 35 U.S.C. 154(b) by 28 days.

(21) Appl. No.: 15/152,218

(22) Filed: May 11, 2016

(65) Prior Publication Data

US 2017/0332492 A1    Nov. 16, 2017

(51) Int. Cl.
*H05K 1/00* (2006.01)
*H05K 1/18* (2006.01)
*H05K 3/30* (2006.01)

(52) U.S. Cl.
CPC ............ *H05K 1/189* (2013.01); *H05K 3/305* (2013.01); *H05K 2201/05* (2013.01); *H05K 2201/0929* (2013.01); *H05K 2201/10227* (2013.01); *H05K 2203/04* (2013.01); *H05K 2203/16* (2013.01)

(58) Field of Classification Search
CPC ................... H05K 1/189; H05K 3/305; H05K 2201/0929; H05K 2201/10227; H05K 2201/05; H05K 2203/16; H05K 2203/04

USPC .......................................... 174/254; 361/749
See application file for complete search history.

(56) References Cited

U.S. PATENT DOCUMENTS

| 5,093,761 A * | 3/1992 | Ozaki | H05K 3/445 |
|---|---|---|---|
| | | | 174/266 |
| 6,483,037 B1 * | 11/2002 | Moore | H05K 1/0278 |
| | | | 174/254 |
| 2014/0048314 A1 * | 2/2014 | Kido | H05K 1/0281 |
| | | | 174/254 |

FOREIGN PATENT DOCUMENTS

| DE | 102005035102 A1 | 2/2007 |
|---|---|---|
| WO | 9949708 | 9/1999 |

OTHER PUBLICATIONS

International Search Report for corresponding WO Application PCT/EP2017/081210 dated Aug. 9, 2017.

* cited by examiner

*Primary Examiner* — Sherman Ng
(74) *Attorney, Agent, or Firm* — Volpe and Koenig, P.C.

(57) ABSTRACT

The invention is related to an electrical circuitry assembly as well as a method for manufacturing such an electrical circuitry assembly, wherein the assembly basically but not exclusively comprising of an electrically conductive metal plate and a circuit including a conductive layer and wherein both the metal plate and the circuit shall be electrically connected to each other.

10 Claims, 1 Drawing Sheet

ELECTRICAL CIRCUITRY ASSEMBLY AND METHOD FOR MANUFACTURING THE SAME

FIELD OF INVENTION

The invention is related to an electrical circuitry.

BACKGROUND

According to current practice, electrical circuitry assemblies including an electrical connection with a circuit, preferably a flexible circuit, are established by direct access to the conductive layer of said circuit, preferably a copper layer, from both sides, which is also known as "back-bared" construction. Thereby, the material forming said conductive layer, e.g. the copper layer, of said circuit is exposed from both sides at a location where an electrical contact to an electrically conductive metal plate shall be established. In particular, electrical connections of a flexible circuit with another electrically conductive member are exemplarily used in the field of battery cell interconnections and battery cell management systems or the like. Consequently, a failure of such an electrical connection usually leads to an irreparable failure of the whole product due to miniaturization of electrical circuits.

However, this known manufacturing procedure and electrical circuitry assembly entails several disadvantages. First, it leads to a structure of the electrical connection which necessitates e.g. the application of a thicker and more expensive copper foil or the application of any kind of mechanical strain relief solution in order to achieve a minimum strength of the electrical connection. Second, the conductive or copper layer of the flexible circuit is exposed to the environment on two sides and further process steps are necessary to provide an adequate protection for the exposed part of the conductive or copper circuit layer. Third, flexible circuits are used in terms of providing flexibility and subsequently a movement of such flexible electrical conductor may cause the breaking of the electrical connection. Finally, there is a need for providing a simplified and reliable construction of electrical interconnections, in particular for electrical circuitry assemblies between a relatively stiff metal plate part and a flexible circuit.

SUMMARY

The invention refers to an electrical circuitry assembly (1), including an electrically conductive metal plate (20), and a circuit (10) to be electrically connected to said metal plate (20). The circuit (10) includes at least one insulating film (12, 13) and a conductive layer (11) being at least partially covered by the at least one insulating film (12, 13) and said circuit (10) comprises, in a preferred connecting area (14) where the electrical connection between said circuit (10) and said metal plate (20) shall be established, at least one exposed section (15) facing the metal plate (20). Said exposed section (15) is at least partially electrically connected to said metal plate (20). Furthermore, a method for manufacturing such an electrical circuitry assembly (1) is provided.

DETAILED DESCRIPTION OF THE PREFERRED EMBODIMENTS

Figure 1:
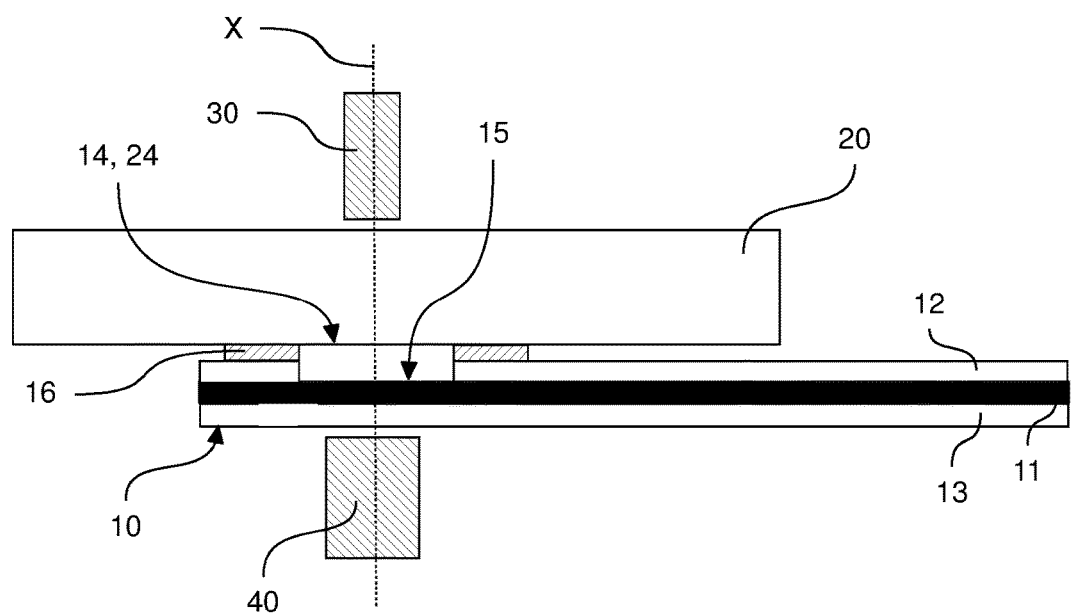
FIG. 1: is an arrangement for manufacturing an example of the electrical circuitry assembly in cross-section view according to the present invention.

The present invention relates to providing an improved construction of an electrical circuitry assembly and a manufacturing process therefore to decrease the necessary manufacturing steps and to reduce manufacturing costs by simultaneously increasing efficiency and reliability of the resulting circuit assembly.

The present invention solves these problems by providing an electrical circuitry assembly according to independent claim 1. Moreover, the present invention comprises a method for manufacturing such an electrical circuitry assembly according to independent claim 7. Further embodiments of the invention are described in the course of the dependent claims 2 to 6 and 8 to 10, respectively.

An electrical circuitry assembly according to the present invention includes an electrically conductive metal plate and a circuit to be electrically connected to said metal plate. Said circuit includes at least one insulating film and a conductive layer being at least partially covered by the at least one insulating film. Furthermore, said circuit comprises, in a preferred connecting area where the electrical connection between said circuit and said metal plate shall be established, at least one exposed section facing the metal plate. Said exposed section is at least partially electrically connected to said metal plate.

In terms of the present invention, the exposed section of the circuit is to be understood as the conductive layer of the circuit not being insulated by the at least one insulating film. Rather, the insulating film is removed from the preferred connecting area of the circuit, in particular such that an electrical contact to the conductive layer is available, in order to achieve the exposed section.

Advantageously, the conductive layer of the circuit is solely exposed at a minimal area, which is intended to be brought into electrical contact with the metal plate. Beyond this exposed section, the conductive layer is completely covered by the at least one insulating film. Thus, unnecessary exposure of the conductive layer to environmental influences is avoided and a durable connection structure between the circuit and the metal plate of the electrical circuitry assembly can be achieved. Furthermore, by providing such a single-sided connection of the circuit, the manufacturing costs are decreased as well.

One advantageous embodiment of the present invention comprises an adhesive means which is provided between said circuit and said metal plate. Consequently, the bonding force is not only created by the electrical connection itself. Thus, the bonding of the circuit and the metal plate of the assembly is additionally supported by said adhesive means. As a result, a higher reliability of the electrical circuitry assembly is provided as e.g. an electrical disconnection caused by separating forces, such as shear or tensile forces, is prevented or the risk thereof is at least substantially reduced.

According to a further embodiment, said adhesive means surrounds said exposed section of the circuit. Thereby, the advantage is achieved that the electrical connection of the circuit with the metal plate is simultaneously sealed by the surrounding adhesive means. Thus, e.g. air humidity cannot affect the electrical connection and subsequently its durability thereof is increased.

According to one embodiment of the present invention, said circuit is a flexible circuit. In particular, the electrical connection of the flexible circuit with a metal plate is provided without the necessity to apply the "back-bared" technique. Thus, the protection and sealing of the flexible circuit, and in particular of the conductive layer, is achieved by the present invention and a cost efficient and improved electrical circuitry assembly is established. Furthermore, the flexible circuit preferably includes copper as the conductive layer material. However, of course any other advantageous electrically conductive material can be used for the conductive layer as well.

In another preferred and advantageous embodiment of the present invention said at least one insulating film comprises a base film and a cover film, wherein the cover film includes the at least one exposed section, and wherein said base film is located on the side of the circuit, in particular on the side of the conductive layer, facing away from the metal plate. Thus, the exposed section comprised by the circuit is realized by an interruption in the cover film at which the insulation is removed from the conductive layer. Advantageously, the base film is able to provide a support function for the conductive layer, even when the electrical connection to the metal plate is established. Consequently, the circuit and its conductive layer are sealed and supported adequately to provide an improved durability of the electrical connection between the circuit and the metal plate.

According to another embodiment, the electrical connection between said circuit and said metal plate is established by welding, in particular by ultrasonic welding, laser welding, resistance welding, vibration welding or friction welding or any other adequate welding technique. In particular, the circuit and the metal plate are electrically connectable in a selective and precise manner. Additionally, it is possible to choose an appropriate welding method for every individual electrical circuitry assembly. Thus, an efficient, costless and durable electrical connection is achieved.

Besides an electrical circuitry assembly, the present invention also refers to a method for manufacturing such an assembly.

According to the present invention, a method for manufacturing an electrical circuitry assembly as described above includes several steps. A first step is to provide the at least one exposed section in a preferred connecting area of said circuit, whereby said preferred connecting area faces the metal plate. Another step is to bring said electrically conductive metal plate and said circuit into alignment in an axis perpendicular to the length extension of said circuit and passing through said exposed section. Consequently, the preferred connecting areas where the electrical connection between said circuit, in particular said conductive layer of said circuit, and said metal plate shall be established are facing each other in an adequate manner. Thereby, the metal plate and the circuit, in particular the preferred connecting area of the metal plate and the exposed section of the circuit, are preferably positioned parallel to each other.

A further step of the method as comprised by the present invention is to establish surface contact with at least a part of said exposed section by applying mechanical force to said circuit and to said metal plate along said axis. In particular, the surface contact can be achieved by providing at least one force application means, e.g. two anvils, being aligned in the same axis as the metal plate and the circuit. As a result, e.g. a first anvil can apply force on a back side of the metal plate, which faces away from the exposed section of the circuit, whereas a second anvil can apply force on a back side of the circuit, in particular on the base film of a flexible circuit, which faces away from the metal plate, respectively.

Furthermore, at least one of the two anvils is preferably movable in order to be able to bring the circuit, the metal plate and the two anvils into contact with each other. In the following, with the at least one movable anvil, said circuit, in particular its conductive layer at the exposed section, and said metal plate can be brought into surface contact at the preferred connecting area by being pressed against the other non-movable anvil. Of course it is also possible that both of the anvils or force application means are movable relative to each other along the alignment axis.

A last step according to the method for manufacturing an electrical circuitry assembly is to establish an electrical connection between said circuit and said metal plate. In particular, the electrical connection shall be established as a solid connection. This means that the electrical connection of said circuit and said metal plate has to be understood as the components being fixed to each other. Thus, a reliable electrical connection is provided which does not show any unnecessary signs of wear during the period of use.

In terms of another embodiment of the method according to the present invention, the steps of establishing surface contact and establishing an electrical connection are conducted simultaneously. In particular, the electrical connection is established while the force transmission means, e.g. the two anvils, are providing surface contact of the circuit and the metal plate. Consequently, the areas of the circuit and the metal plate are electrically connected with each other in a precise manner, as this electrical connection is provided at the surface contact areas of the circuit and the metal plate.

Thereby, the force transmission means, e.g. the two anvils, are preferably configured not only to apply force in order to achieve surface contact but also to provide any kind of energy to the circuit and the metal plate to establish an electrical connection between the two components. Hence, the two anvils can be designed e.g. as welding anvils.

In terms of another embodiment, the adhesive means is being applied to selectively bond said circuit to said metal plate. Consequently, the adhesive means can be applied between the circuit and the metal plate either before or after the electrical connection is established. In particular, by providing the adhesive means after the bonding process, the established electrical connection can be sealed accordingly. Further, the connection of the circuit and the metal plate is additionally supported by the adhesive means. Therefore, any kind of separating force, such as shear or tensile forces, being applied on the electrical connection can be at least partially received by the adhesive connection. Thus, a breakage of the electrical connection due to application of external forces can be avoided or at least substantially reduced.

According to a further embodiment, the adhesive means is being applied to selectively bond said circuit to said metal plate in a pre-determined connecting area. Thus, the application of said adhesive means to either the metal plate or the circuit, in particular to the cover film insulating the circuit, is applicable to provide a pre-positioning for aligning the circuit and the metal plate. The term pre-determined connecting area subsequently means to identify and define the preferable connecting areas of the circuit and the metal plate in advance to the further connecting process. Consequently, the process of achieving surface contact and establishing an electrical connection can be simplified by this pre-alignment in advance to achieving surface contact by the force transmission means. Furthermore, the circuit and the metal plate can be electrically connected with each other independent from their orientation in space. Consequently, the circuit can be positioned above or below the metal plate or the two components can be positioned next to each other being aligned along a horizontal axis, for example. Subsequently, the selective bonding by the adhesive means facilitates the manufacturing process by dividing the manufacturing process into single, easily performable steps. Additionally, manufacturing costs are reduced thereby as well as the necessary effort in order to provide a reliable electrical connection of high quality.

In the following, the present invention is described in more detail by referring to the comprised figures. However, further conceivable examples of the present invention shall not be excluded thereby.

Figure 2:
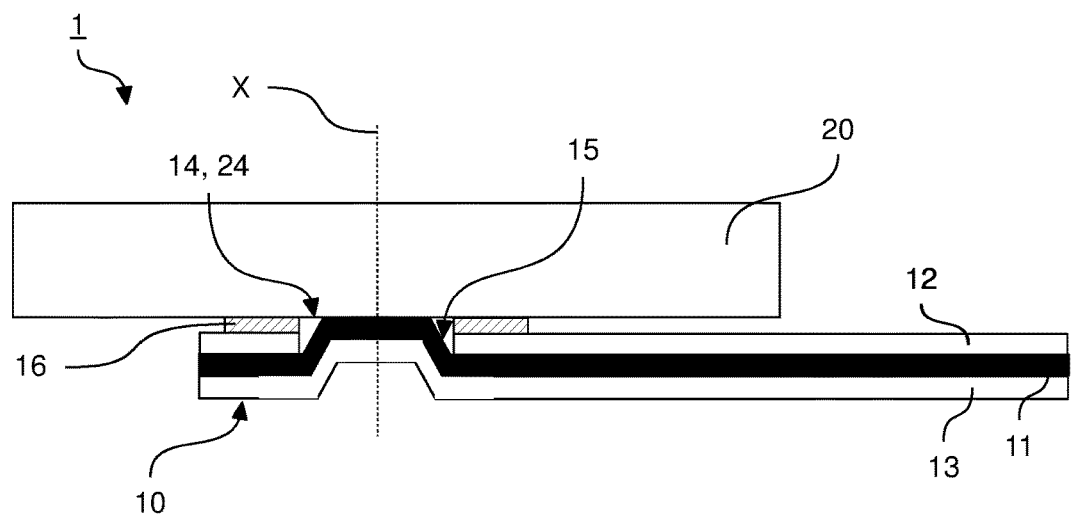
FIG. 2: is an example of the electrical circuitry assembly in cross-section view according to the present invention.

Thus, the figures schematically illustrate:

FIG. 1: an arrangement for manufacturing an example of the electrical circuitry assembly in cross-section view according to the present invention; and FIG. 2: an example of the electrical circuitry assembly in cross-section view according to the present invention.

FIG. 1 shows a metal plate 20 and a circuit 10, in particular a flexible circuit 10, comprising a conductive layer 11 which is preferably made of copper. The conductive layer 11 is insulated on a first side by a cover film 12 and on a second side by a base film 13. The flexible circuit 10 is arranged in a manner such that the cover film 12 faces a surface of the metal plate 20. The cover film 12 is interrupted in a preferred connecting area 14 such that an exposed section 15 of the circuit 10, in particular of its conductive layer 11, is provided. Thus, the exposed section 15 faces the metal plate 20. In contrast thereto, the base film 13 is a continuous layer supporting the conductive layer 11 adequately in order to achieve a necessary stability of the flexible circuit 10.

Furthermore, said metal plate 20 and said flexible circuit 10 are aligned with each other along an alignment axis X. However, the alignment axis does not necessarily represent an axis of symmetry of the exposed section 15. In particular, a preferred connecting area 24 of the metal plate 20 and the preferred connecting area 14 of the flexible circuit 10 are facing each other. Subsequently, the exposed section 15 of the flexible circuit 10 is brought into alignment with the preferred connecting area 24 of the metal plate 20. However, the exposed section 15 of the flexible circuit 10 can comprise any conceivable and appropriate geometry to provide an electrical contact between the flexible circuit 10 and the metal plate 20.

According to FIG. 1 the adhesive means is being applied on the cover film 12 before the bonding process for providing an electrical connection between the circuit 10, in particular the conductive layer 11, and the metal plate 20. Thus, said flexible circuit 10 and said metal plate 20, in particular the respective preferred connecting areas 14, 24 including the exposed section 15, are pre-positioned relative to each other along the alignment axis X. Thereby, said adhesive means 16 surrounds the preferred connecting area 14 and in particular the exposed section 15 of the circuit 10. Subsequently, the shape of the applied adhesive means 16 preferably corresponds to the geometry of the exposed section 15 of the flexible circuit 10.

Additionally, a first welding anvil 30 and a second welding anvil 40 are aligned along the axis X as well. Thus, the two welding anvils 30, 40 represent force transmission means according to the present invention. The first welding anvil 30 is positioned above the metal plate and the second welding anvil 40 is positioned below the flexible circuit 10 according to FIG. 1. By at least one of the two welding anvils 30, 40 being movable, a force can be applied on the electric circuitry assembly in order to achieve surface contact between at least a part of the exposed section 15 of the flexible circuit 10 and the preferred connecting area 24 of the metal plate 20. Of course, both anvils can be provided to be relatively movable along the axis X as well. Thus, as soon as the second anvil 40 comes into contact with the base film of the flexible circuit 10, a deforming force is applied to the flexible circuit 10 resulting in a surface contact between the conductive layer 11 at the exposed section 15 and the metal plate 20. By preferably providing surface contact and establishing an electrical connection simultaneously, the bonding process is performed, e.g. in terms of any kind of welding process.

In FIG. 2 an electrical circuitry assembly 1 is illustrated which results from the manufacturing process as described in reference to FIG. 1. The metal plate 20 and the flexible circuit 10 are electrically connected with each other by the bonding process. In particular, an electrical connection between the conductive layer 11 at the exposed section 15 of the flexible circuit 10 and the preferred connecting area 24 of the metal plate 20 has been achieved by a deformation of the flexible circuit 10, in particular by a deformation of the conductive layer 11 and the base film 13, and a subsequent welding process. Thus, the base film 13 provides a mechanical support to the conductive layer 11, which is preferably made of copper.

Furthermore, FIG. 2 shows that the electrical connection exists over at least a part of the originally exposed section 15 of the circuit 10. The surrounding adhesive means 16 thereby represents a sealing for the electrical connection in order to avoid any environmental influence on the electrical connection. Consequently, the illustrated example of an electrical circuitry assembly 1 according to the present invention is capable of solving the underlying problems by providing an improved construction which can be achieved in the course of a simplified and cost reducing manufacturing process and by simultaneously increasing the efficiency as well as the reliability of the resulting electrical circuit.

LIST OF REFERENCES

X axis for alignment
1 electrical circuitry assembly
10 (flexible) circuit
11 conductive layer
12 cover film
13 base film
14 preferred connecting area (of the (flexible) circuit)
15 exposed section
16 adhesive means
20 metal plate
24 preferred connecting area (of the metal plate)
30 first welding anvil
40 second welding anvil

What is claimed is:

1. An electrical circuitry assembly (1) comprising:
an electrically conductive metal plate (20), and
a circuit (10) to be electrically connected to said metal plate (20),
wherein said circuit (10) includes at least one insulating film (12, 13) and a conductive layer (11) being at least partially covered by the at least one insulating film (12, 13),
wherein said circuit (10) comprises, in a preferred connecting area (14) where the electrical connection between said circuit (10) and said metal plate (20) shall be established, at least one exposed section (15) facing the metal plate (20), and wherein said exposed section (15) is at least partially electrically connected to said metal plate (20).

2. The electrical circuitry assembly (1) of claim 1, wherein an adhesive (16) is provided between said circuit (10) and said metal plate (20).

3. The electrical circuitry assembly (1) of claim 2, wherein said adhesive (16) surrounds said exposed section (15) of the circuit (10).

4. The electrical circuitry assembly (1) of claim 1, wherein said circuit (10) is a flexible circuit.

5. The electrical circuitry assembly (1) of claim 1, wherein said at least one insulating film (12, 13) comprises a base film (13) and a cover film (12), wherein the cover film (12) includes the at least one exposed section (15), and wherein said base film (13) is located on the side of the circuit (10) facing away from the metal plate (20).

6. The electrical circuitry assembly (1) of claim 1, wherein the electrical connection between said circuit (10) and said metal plate (20) is established by welding, in particular by ultrasonic welding, laser welding, resistance welding, vibration welding or friction welding.

7. A method for manufacturing an electrical circuitry assembly (1), the method comprising:

providing an at least one exposed section (15) in a preferred connecting area (14) of a circuit (10), whereby said preferred connecting area (14) faces a metal plate (20), bringing said electrically conductive metal plate (20) and said circuit (10) into alignment in an axis (X) perpendicular to the length extension of said circuit (10) and passing through said exposed section (15);

establishing surface contact with at least a part of said exposed section (15) by applying mechanical force to said circuit (10) and to said metal plate (20) along said axis (X); and establishing an electrical connection between said circuit (10) and said metal plate (20).

8. The method of claim 7, wherein the steps of establishing surface contact and establishing an electrical connection are being conducted simultaneously.

9. The method of claim 7 further comprising, applying an adhesive (16) to selectively bond said circuit (10) to said metal plate (20).

10. The method of claim 9, wherein the adhesive (16) is applied in a pre-determined connecting area.

* * * * *